(12) United States Patent
Chang et al.

(10) Patent No.: US 11,322,421 B2
(45) Date of Patent: May 3, 2022

(54) PACKAGE STRUCTURE AND METHOD OF FORMING THE SAME

(71) Applicant: Taiwan Semiconductor Manufacturing Co., Ltd., Hsinchu (TW)

(72) Inventors: Mao-Yen Chang, Kaohsiung (TW); Chih-Wei Lin, Hsinchu County (TW); Hao-Yi Tsai, Hsinchu (TW); Kuo-Lung Pan, Hsinchu (TW); Chun-Cheng Lin, New Taipei (TW); Tin-Hao Kuo, Hsinchu (TW); Yu-Chia Lai, Miaoli County (TW); Chih-Hsuan Tai, Taipei (TW)

(73) Assignee: Taiwan Semiconductor Manufacturing Company, Ltd., Hsinchu (TW)

(*) Notice: Subject to any disclaimer, the term of this patent is extended or adjusted under 35 U.S.C. 154(b) by 8 days.

(21) Appl. No.: 16/924,208

(22) Filed: Jul. 9, 2020

(65) Prior Publication Data
US 2022/0013422 A1 Jan. 13, 2022

(51) Int. Cl.
| | |
|---|---|
| *H01L 23/40* | (2006.01) |
| *H01L 23/31* | (2006.01) |
| *H01L 25/065* | (2006.01) |
| *H01L 21/56* | (2006.01) |
| *H01L 25/00* | (2006.01) |
| *H01L 23/538* | (2006.01) |
| *H01L 23/498* | (2006.01) |
| *H01L 23/00* | (2006.01) |

(52) U.S. Cl.
CPC ........ *H01L 23/3157* (2013.01); *H01L 21/563* (2013.01); *H01L 23/40* (2013.01); *H01L 23/49822* (2013.01); *H01L 23/5383* (2013.01); *H01L 24/97* (2013.01); *H01L 25/0655* (2013.01); *H01L 25/50* (2013.01)

(58) Field of Classification Search
CPC .............. H01L 23/3157; H01L 21/563; H01L 23/49822; H01L 23/5383; H01L 25/0655
See application file for complete search history.

(56) References Cited

U.S. PATENT DOCUMENTS

| | | |
|---|---|---|
| 9,000,584 B2 | 4/2015 | Lin et al. |
| 9,048,222 B2 | 6/2015 | Hung et al. |
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |

(Continued)

*Primary Examiner* — Nicholas J Tobergte
(74) *Attorney, Agent, or Firm* — JCIPRNET

(57) ABSTRACT

Provided is a package structure including a composite wafer, a plurality of dies, an underfill, and a plurality of dam structures. The composite wafer has a first surface and a second surface opposite to each other. The composite wafer includes a plurality of seal rings dividing the composite wafer into a plurality of packages; and a plurality of through holes respectively disposed between the seal rings and penetrating through the first and second surfaces. The dies are respectively bonded onto the packages at the first surface by a plurality of connectors. The underfill laterally encapsulates the connectors. The dam structures are disposed on the first surface of the composite wafer to separate the underfill from the through holes.

20 Claims, 14 Drawing Sheets

(56) References Cited

U.S. PATENT DOCUMENTS

| | | |
|---|---|---|
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 10,283,461 B1* | 5/2019 | Wang .................... H01L 23/485 |
| 2006/0273430 A1* | 12/2006 | Hua ...................... B81C 1/0023 |
| | | 257/621 |
| 2015/0014863 A1* | 1/2015 | Shih ........................ H01L 24/81 |
| | | 257/777 |
| 2016/0268167 A1* | 9/2016 | Matsuura ............ H01L 29/2003 |

* cited by examiner

PACKAGE STRUCTURE AND METHOD OF FORMING THE SAME

BACKGROUND

The semiconductor industry has experienced rapid growth due to continuous improvements in the integration density of various electronic components (i.e., transistors, diodes, resistors, capacitors, etc.). For the most part, this improvement in integration density has come from continuous reductions in minimum feature size, which allows more of the smaller components to be integrated into a given area. These smaller electronic components also demand smaller packages that utilize less area than previous packages. Some smaller types of packages for semiconductor components include quad flat packages (QFPs), pin grid array (PGA) packages, ball grid array (BGA) packages, flip chips (FC), three-dimensional integrated circuits (3DICs), wafer level packages (WLPs), and package on package (PoP) devices and so on.

Currently, integrated fan-out packages are becoming increasingly popular for their compactness. Therefore, there are many challenges related to the integrated fan-out packages.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
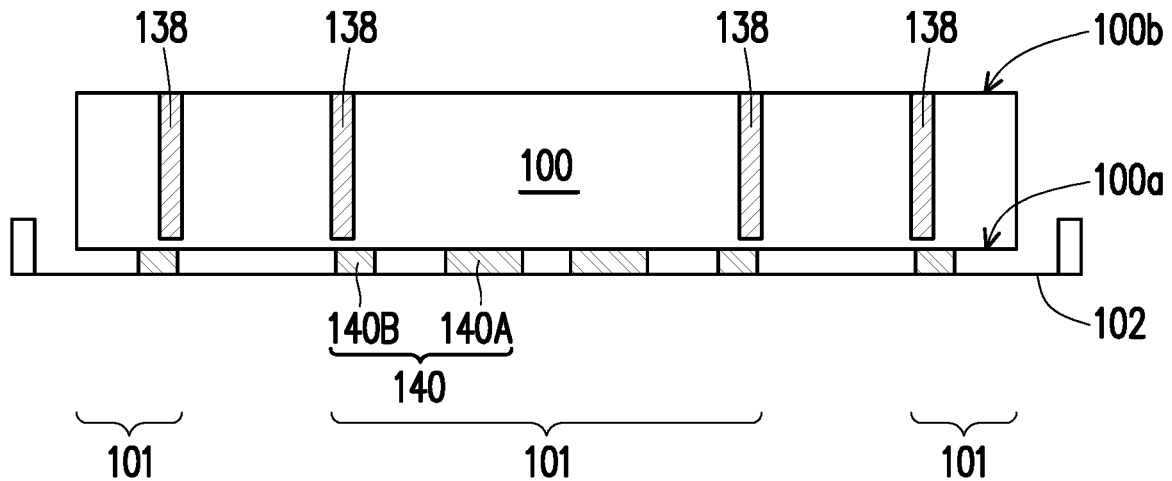
FIG. 1A to FIG. 1D are schematic cross-sectional views illustrating a process flow for fabricating a package structure in accordance with a first embodiment of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1D are schematic cross-sectional views illustrating a process flow for fabricating a package structure in accordance with a first embodiment of the present disclosure. FIG. 2 is an embodiment of a cross-sectional view of a composite wafer illustrated in FIG. 1A.

Figure 2:
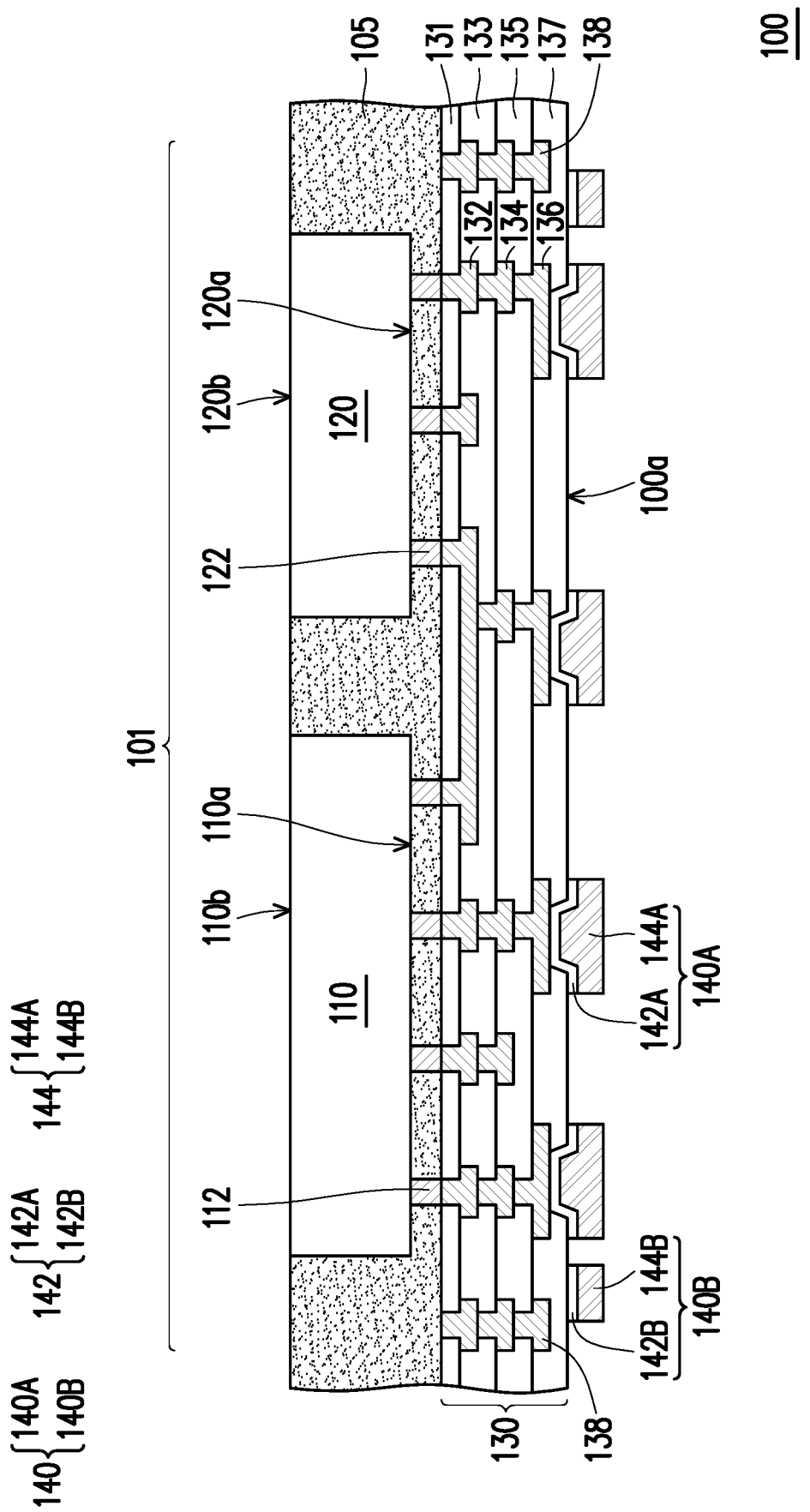
FIG. 2 is an embodiment of a cross-sectional view of a composite wafer illustrated in FIG. 1A.

Referring to FIG. 1A, a composite wafer 100 having a first surface 100a and a second surface 100b opposite to each other is provided. The composite wafer 100 is mounted on a tape 102 and the first surface 100a faces toward the tape 102. In some embodiments, the composite wafer 100 may include a plurality of packages 101. The packages 101 are defined or surrounded by a plurality of seal rings 138. In the words, the composite wafer 100 is divided into the packages 101 by the seal rings 138. In the present embodiment, the packages 101 may be integrated fan-out (InFO) packages.

Specifically, as shown in FIG. 2, the composite wafer 100 may include a first die 110, a second die 120, an encapsulant 105, a redistribution line (RDL) structure 130, and a conductive layer 140. In some embodiments, each of the first die 110 and the second die 120 may be a logic die, which may be a Central Processing Unit (CPU) die, a Graphic Processing Unit (GPU) die, a mobile application die, a Micro Control Unit (MCU) die, an input-output (10) die, a Base-Band (BB) die, or an Application processor (AP) die. Each of first die 110 and the second die 120 may also be a System-On-Chip die, a memory die (such as a Static Random-Access Memory (SRAM) die or a Dynamic Random-Access Memory (DRAM) die), a High-Bandwidth-Memory (HBM) cube, or the like.

In some embodiments, each of the first die 110 and the second die 120 includes a semiconductor substrate, a device region on the semiconductor substrate, and an interconnect structure on the device region. The device region may include a wide variety of devices. In some embodiments, the devices include active components, passive components, or a combination thereof. In some embodiments, the devices may include integrated circuits devices. The devices are, for example, transistors, capacitors, resistors, diodes, photodiodes, fuse devices, or other similar devices. Other devices, such as capacitors, resistors, diodes, photodiodes, fuses and the like may also be formed in the device region. The functions of the devices may include memory, processors, sensors, amplifiers, power distribution, input/output circuitry, or the like. As shown in FIG. 2, the first die 110 further includes a plurality of contacts 112 to electrically connect the device region or the interconnect structure thereof. The second die 120 also includes a plurality of contacts 122 to electrically connect the device region or the interconnect structure thereof. In some embodiments, the contacts 112 and 122 may be metal pillars, such as copper pillars, which may or may not include additional layers such as nickel layers, gold layers, palladium layers, or the like. The contacts 112 and 122 may have vertical and straight edges, and may protrude the active surface 110a of the first die 110 and the active surface 120a of the second die 120, respectively.

In some embodiments, the first die 110 and the second die 120 have the same size or different sizes. Herein, the term "size" is referred to the length, width, or area. For example, as shown in FIG. 2, the length of the first die 110 is greater than the length of the second die 120. In addition, the first die 110 and the second die 120 may have the same height or different heights. Further, the first die 110 and the second die 120 may have the same function or different functions. Although only two dies are illustrated in FIG. 2, the number of the dies is not limited by the disclosure. In other embodiments, one die or more than two dies, such as three, four, or five dies, are included in the single package 101.

As shown in FIG. 2, the first die 110 and the second die 120 are laterally encapsulated by the encapsulant 105. The encapsulant 105 may be formed by following steps which includes: forming a encapsulant material to wrap the first and second dies 110 and 120 and further cover a backside 110b of the first die 110 and a backside 120b of the second die 120; and performing a planarization process, such as a Chemical Mechanical Polish (CMP) process or a mechanical grinding process, to thin the encapsulating material, until the backside 110b of the first die 110 and the backside 120b of the second die 120 are exposed. In some embodiments, the encapsulant material includes a molding compound, a molding underfill, an epoxy, and/or a resin.

Alternatively, the encapsulant material may also include a base material and filler particles in base material. The base material may be a polymer, a resin, an epoxy, or the like. The filler particles may be dielectric particles of $SiO_2$, $Al_2O_3$, silica, or the like, and may have spherical shapes. Also, the spherical filler particles may have a plurality of different diameters. In some other embodiments, the encapsulant 105 include an underfill (not shown) and a molding compound. The underfill is filled in gaps between the contacts 112 and 122, and laterally encapsulates the contacts 112 and 122. The molding compound laterally encapsulates the underfill, and sidewalls of the first and second dies 110 and 120.

As shown in FIG. 2, the RDL structure 130 is formed on the active surface 110a of the first die 110, the active surface 120a of the second die 120, and the encapsulant 105. In some embodiments, the RDL structure 130 includes a plurality of dielectric layers 131, 133, 135, and 137 and a plurality of redistribution layers 132, 134, and 136 stacked alternately. The number of the dielectric layers or the redistribution layers is not limited by the disclosure.

In detail, the redistribution layer 132 penetrates through the dielectric layer 131 and is electrically connected to the contacts 112 and 122, respectively. The redistribution layer 134 penetrates through the dielectric layer 133 and is electrically connected to the redistribution layer 132. The redistribution layer 136 penetrates through the dielectric layer 135 and is electrically connected to the redistribution layer 134. The dielectric layer 137 covers the redistribution layer 136. In some embodiments, each of the dielectric layers 131, 133, 135, and 137 includes a polymer material, such as polybenzoxazole (PBO), polyimide (PI), benzocyclobutene (BCB), a combination thereof or the like. The dielectric layers are formed by coating the polymer material in a flowable form, and then curing the polymer material. In alternative embodiments, each of the dielectric layers 131, 133, 135, and 137 includes an inorganic dielectric material, such as silicon nitride, silicon oxide, or the like. The formation method may include chemical vapor deposition (CVD), atomic layer deposition (ALD), plasma-enhanced chemical vapor deposition (PECVD), or other applicable deposition methods. In some embodiments, each of the redistribution layers 132, 134, and 136 includes conductive materials. The conductive materials include metal such as copper, nickel, titanium, a combination thereof or the like, and are formed by an electroplating process. In some embodiments, the redistribution layers 132, 134, and 136 respectively includes a seed layer (not shown) and a metal layer formed thereon (not shown). The seed layer may be a metal seed layer such as a copper seed layer. In some embodiments, the seed layer includes a first metal layer such as a titanium layer and a second metal layer such as a copper layer over the first metal layer. The metal layer may be copper or other suitable metals. In some embodiments, the redistribution layers 132, 134, and 136 respectively includes a plurality of vias and a plurality of traces connected to each other. The vias connects the traces, and the traces are respectively located on the dielectric layers 131, 133, and 135, and are respectively extending on the top surface of the dielectric layers 131, 133, and 135.

It should be noted that some portions of the redistribution layers 132, 134, and 136 are vertically stacked to form a seal ring 138. In some embodiments, the seal ring 138 is referred to as a stress protection structure, which surrounds the first and second dies 110 and 120 to protect the internal circuit inside the first and second dies 110 and 120 from damage caused by the subsequent drilling process. As shown in FIG. 1A, the composite wafer 100 is divided into the packages 101 by the seal rings 138. That is, the seal ring 138 is located at the edge of the corresponding package 101, as shown in FIG. 2. In some embodiments, the seal rings 138 are formed with the redistribution layers 132, 134, and 136 in the same step. Alternatively, the seal rings 138 may be formed independently of the redistribution layers 132, 134, and 136. In some embodiments, the seal rings 138 are electrically floated, or electrically grounded. That is, the seal rings 138 may be electrically isolated from other portion of the redistribution layers 132, 134, and 136 in the RDL structure 130 or electrically isolated from the first and second dies 110 and 120.

After forming the dielectric layer 137, a conductive layer 140 is formed on the first surface 100a of the composite wafer 100. In some embodiments, the conductive layer 140 is referred to as a topmost redistribution layer of the RDL structure 130. Specifically, the conductive layer 140 may include a first conductive feature 140A and a second conductive feature 140B. The first conductive feature 140A penetrates through the dielectric layer 137 to contact the redistribution layer 136. The first conductive feature 140A may be electrically connected to the first die 110 and the second die 120 by the redistribution layers 132, 134, and 136. In some embodiments, the first conductive feature 140A includes an under-ball metallurgy (UBM) layer 142A and a conductive pillar 144A on the UBM layer 142A. The UBM layer 142A may include nickel, copper, titanium, or multi-layers thereof. For example, the UBM layer 142A include a titanium layer and a copper layer over the titanium layer. The conductive pillar 144A may include a conductive material with low resistivity, such as Sn, Pb, Ag, Cu, Ni, Bi or an alloy thereof, and may be formed by a suitable process such as evaporation, plating, ball drop, or screen printing. Alternatively, the UBM layer may be omitted and the conductive pillar 144A is in contact with the redistribution layer 136.

On the other hands, the second conductive feature 140B may be disposed between the seal ring 138 and the first conductive feature 140A. The second conductive feature 140B may also include an UBM layer 142B and a conductive pillar 144B on the UBM layer 142B. In some embodiment, the second conductive feature 140B is electrically floated or electrically grounded. From another perspective, the second conductive feature 140B is electrically isolated from the first and second dies 110 and 120. Alternatively, the UBM layer may be omitted and the conductive pillar 144B is in contact with the dielectric layer 137.

Figure 1B:
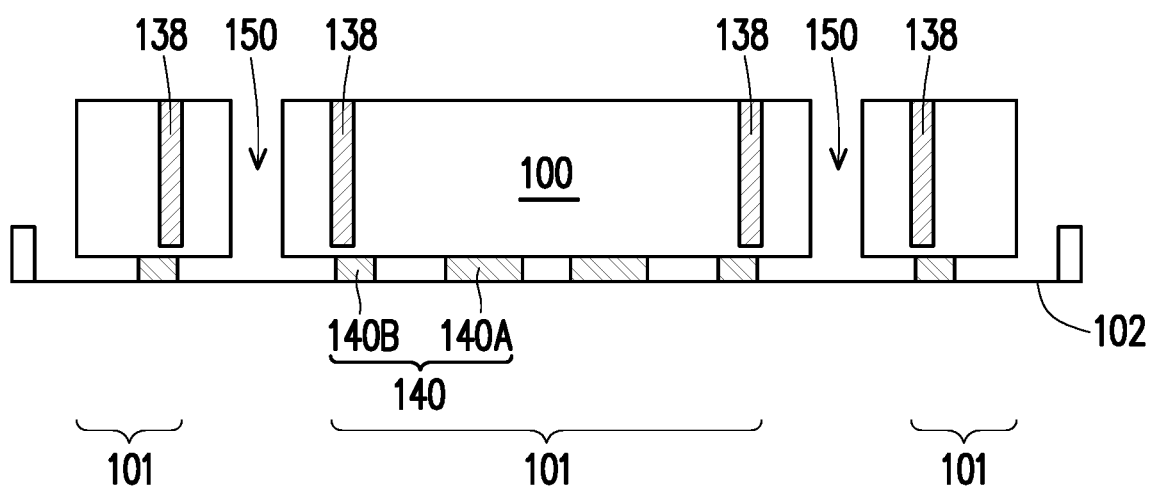

Referring to FIG. 1B, a plurality of through holes 150 are formed between the seal rings 138 by a drilling process, such as laser drilling, mechanical drilling, or the like. The through holes 150 penetrate through the first surface 100*a* and the second surface 100*b* of the composite wafer 100. In some embodiments, the through holes 150 is referred to as screw holes or bolt holes.

Figure 1C:
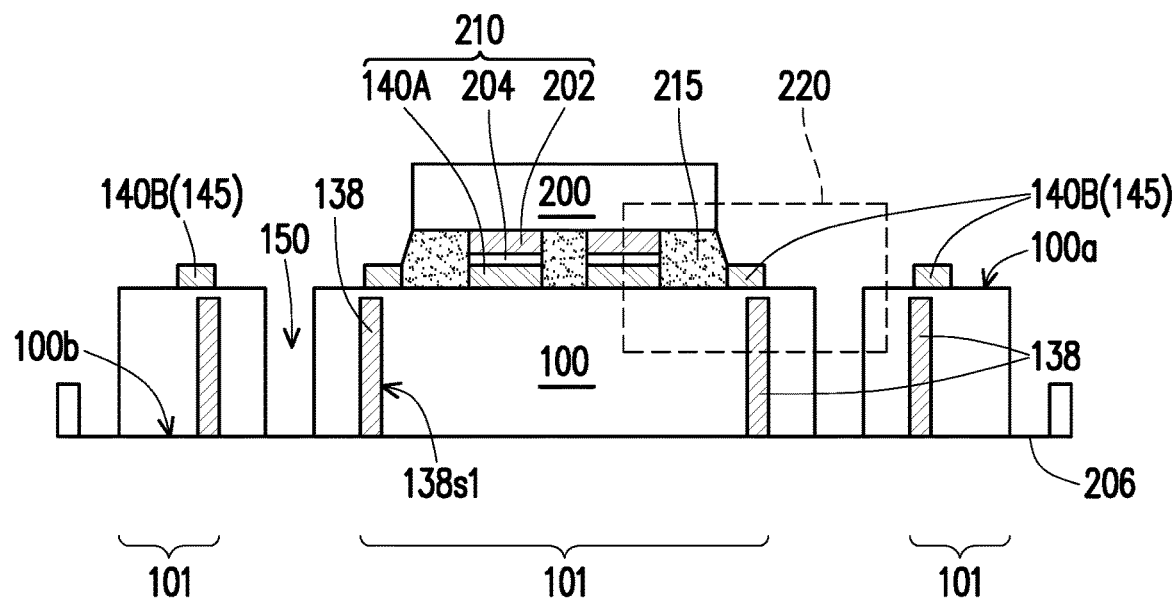
Figure 1D:
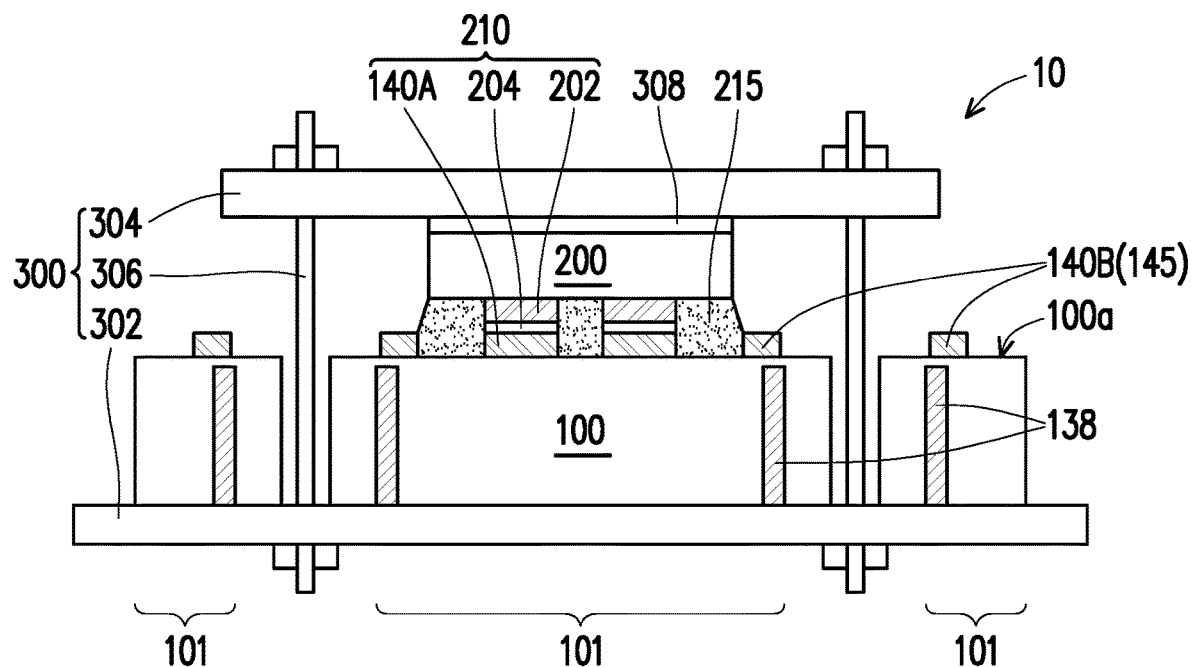

FIG. 1C illustrates a tape swap. During the tape swap, another tape 206 is attached onto the second surface 100*b* of the composite wafer 100, while the tape 102 is attached onto the first surface 100*a* of the composite wafer 100 (as shown in FIG. 1B). Next, the composite wafer 100 is demounted from the tape 102. In the case, the first surface 100*a* of the composite wafer 100 faces upward, as shown in FIG. 1C.

After the tape swap, a die 200 is provided. In some embodiments, the die 200 may be a logic die, which may be a Central Processing Unit (CPU) die, a Graphic Processing Unit (GPU) die, a mobile application die, a Micro Control Unit (MCU) die, an input-output (IO) die, a BaseBand (BB) die, or an Application processor (AP) die. The die 200 may also be a System-On-Chip die, a memory die (such as a Static Random-Access Memory (SRAM) die or a Dynamic Random-Access Memory (DRAM) die), a High-Bandwidth-Memory (HBM) cube, or the like.

In some embodiments, the die 200 includes a semiconductor substrate, a device region on the semiconductor substrate, and an interconnect structure on the device region. The device region may include a wide variety of devices. In some embodiments, the devices include active components, passive components, or a combination thereof. In some embodiments, the devices may include integrated circuits devices. The devices are, for example, transistors, capacitors, resistors, diodes, photodiodes, fuse devices, or other similar devices. Other devices, such as capacitors, resistors, diodes, photodiodes, fuses and the like may also be formed in the device region. The functions of the devices may include memory, processors, sensors, amplifiers, power distribution, input/output circuitry, or the like. The die 200 further includes a plurality of contacts 202 and a plurality of solder caps 204 on the contacts 202 to electrically connect the device region or the interconnect structure thereof. In some embodiments, the die 200 has the same size or different sizes from the first and second dies 110 and 120. In addition, the die 200 may have the same function or different functions from the first and second die 110 and 120.

Thereafter, the contacts 202 and the solder caps 204 of the die 200 are aligned with the first conductive feature 140A of the composite wafer 101. A joint process is then performed to joint the contacts 202 and the solder caps 204 onto the first conductive feature 140A, so as to form a plurality of connectors 210. In some embodiments, the connectors 210 are micro-bumps which include at least three layers, such as two metal pillars (e.g., Cu, Ni, Al, Ag, Au, or a combination thereof) and a solder sandwiched between two metal pillars. However, the disclosure is not limited thereto. In other embodiments, the connectors 210 are more than three-layered structures or solder balls. After the joint process, the die 200 is bonded onto the corresponding package 101. Although only single die 200 is illustrated in FIG. 1C, the number of the dies is not limited by the disclosure. That is, two or more dies may be bonded onto the same package 101 by the connectors 210. The two or more dies may have the same size/height/function or different sizes/heights/functions.

After bonding the die 200 onto the package 101, an underfill material is dispensed to fill in the gaps between the connectors 210. After curing the underfill material, an underfill 215 is formed to laterally encapsulate the connectors 210. In some embodiments, the underfill material may include a base material and filler particles in base material. The base material may be a polymer, a resin, an epoxy, or the like. The filler particles may be dielectric particles of $SiO_2$, $Al_2O_3$, silica, or the like, and may have spherical shapes. Also, the spherical filler particles may have a plurality of different diameters.

It should be noted that the second conductive feature 140B between the seal ring 138 and the first conductive feature 140A is able to prevent the underfill material from flowing or bleeding into the through holes 150. In the case, the second conductive feature 140B may be referred to as a dam structure (hereinafter "dam structure 145"), which may block the underfill material to stay in a space between the dam structure 145 and the connectors (which is also called as joint pads) 210, thereby separating the underfill 215 from the through holes 150. On the other hands, the dam structure 145 may be referred to as a monitor mark to control the dispensing process of the underfill material. For example, after the underfill material is dispensed, a visual inspection or an automated optical inspection may be performed to confirm the position of the underfill material overflowing, thereby controlling the parameters of the dispensing process of the underfill material.

Figure 3:
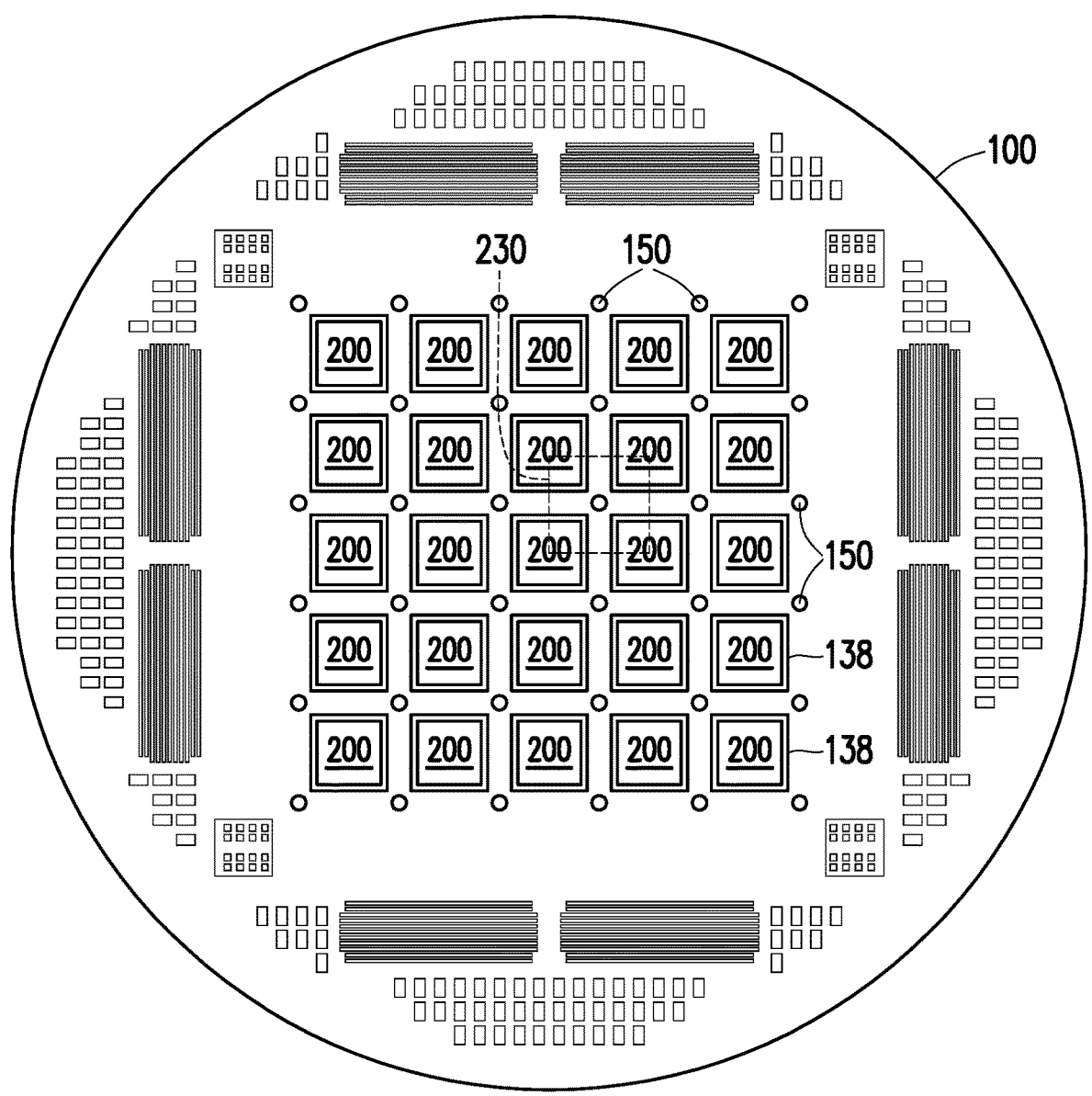
FIG. 3 is an embodiment of a schematic top view of a structure illustrated in FIG. 1C.

FIG. 3 shows a schematic top view of a structure illustrated in FIG. 1C. Referring to FIG. 3, a plurality of dies 200 are arranged as an array. In the present embodiment, single die 200 is disposed on the corresponding package 101 (as shown in FIG. 2). Each seal ring 138 surrounds the corresponding package 101. Each seal ring 138 has an area enclosed by its perimeter, and the area is greater than an area of the overlying die 200. That is, a perimeter of the die 200 is located within a region enclosed by an inner sidewall 138*s*1 of the underlying seal ring 138, as shown in FIG. 1C. In addition, the through holes 150 are located at four corners of the die 200 respectively, as shown in FIG. 3. The through holes 150 are also arranged as an array.

In addition to the blocking effect, the said dam structure may have the function of guiding the flow of the underfill material, so that the underfill material would not flow into the through hole during the dispensing process. The configuration and the function of the dam structures with different shapes would be illustrated in the following paragraphs.

Figure 4A:
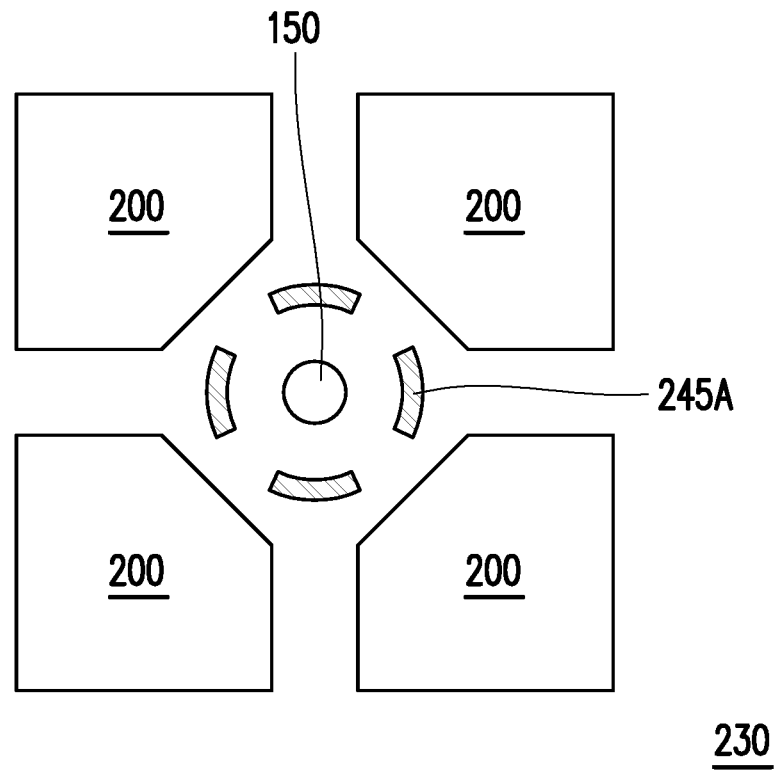
FIG. 4A and FIG. 5A are some embodiments of schematic top views of a region illustrated in FIG. 3.
Figure 4B:
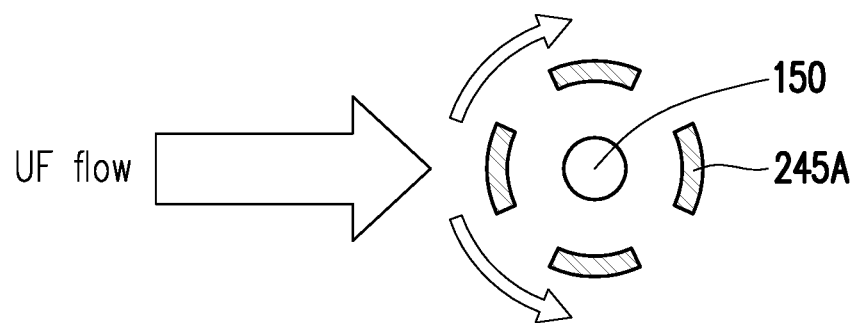
FIG. 4B and FIG. 5B respectively show an underfill material flowing through a dam structure illustrated in FIG. 4A and FIG. 5A.
Figure 5A:
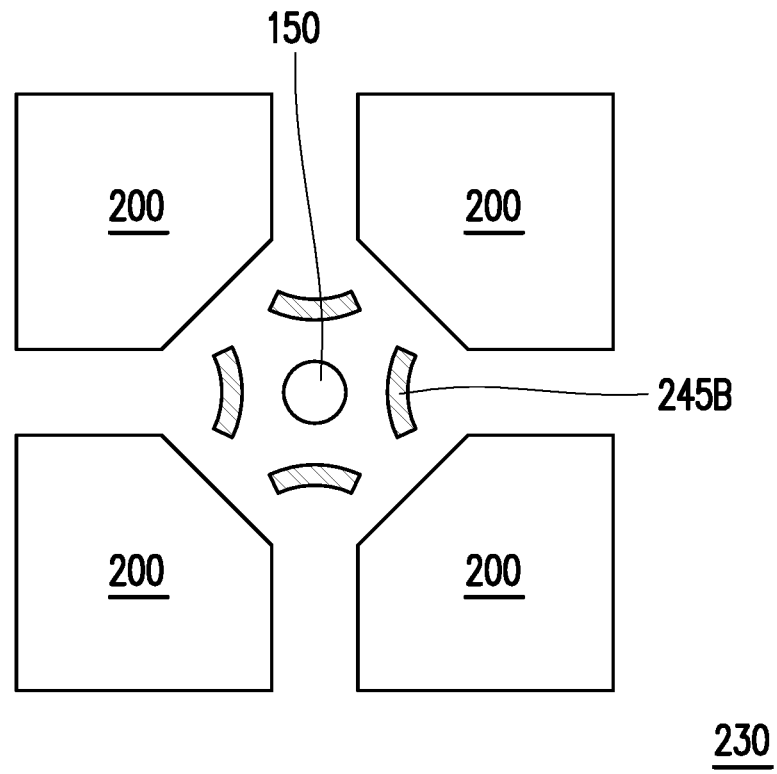
Figure 5B:
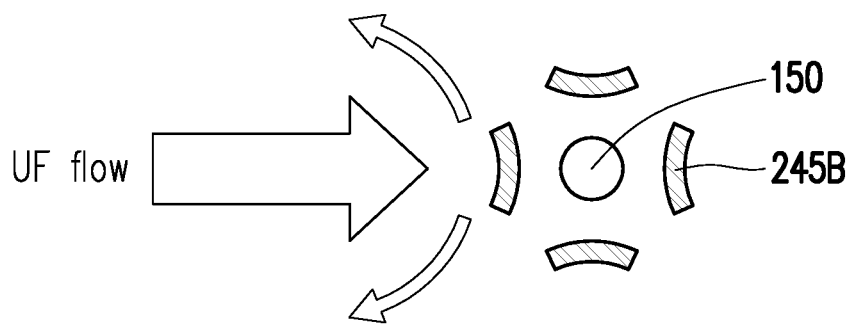

FIG. 4A and FIG. 5A are some embodiments of schematic top views of a region 230 illustrated in FIG. 3. FIG. 4B and FIG. 5B respectively show an underfill material flowing through a dam structure illustrated in FIG. 4A and FIG. 5A.

As shown in FIG. 4A, a dam structure 245A may be a disconnected or discontinuous ring structure that surrounds the through hole 150. In some embodiments, the dam structure 245A includes four arc segments protruding along a direction from the through hole 150 toward the dies 200. When the underfill material bleeds, the underfill material may flow along the dam structure 245A without overflowing into the through hole 150, as shown in FIG. 4B. Alternatively, as shown in FIG. 5A, a dam structure 245B may include four arc segments protruding along a direction from the dies 200 toward the through hole 150. When the underfill material bleeds, the underfill material may flow along the dam structure 245B without overflowing into the through hole 150, as shown in FIG. 5B.

FIG. 6A to FIG. 6E are various embodiments of schematic top views of a region 230 illustrated in FIG. 3.

Figure 6A:
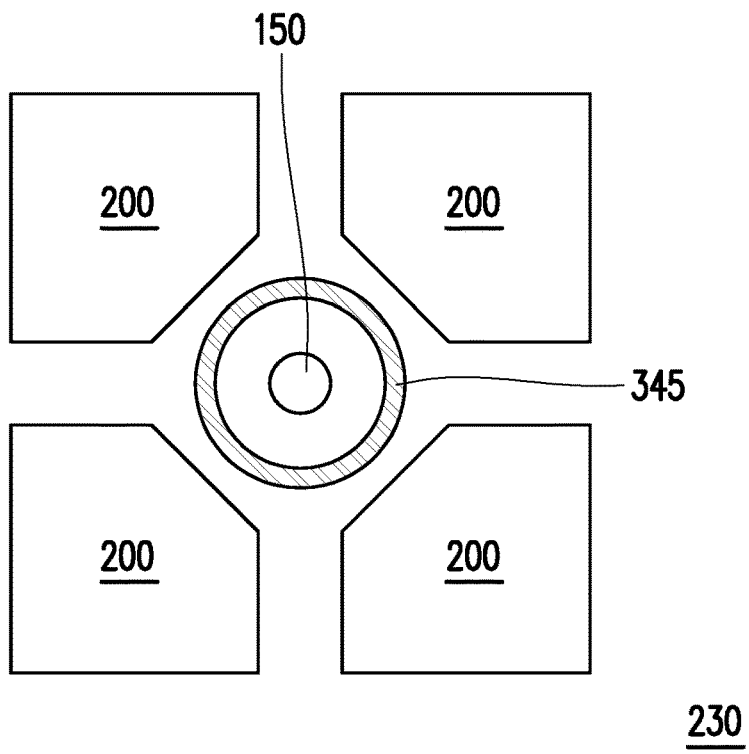
FIG. 6A to FIG. 6E are various embodiments of schematic top views of a region illustrated in FIG. 3.
Figure 6B:
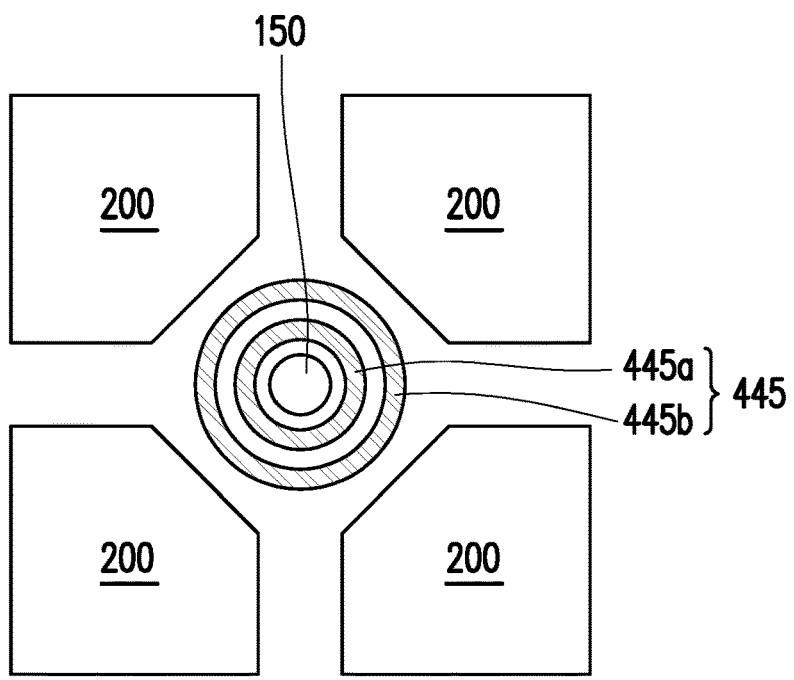
Figure 6C:
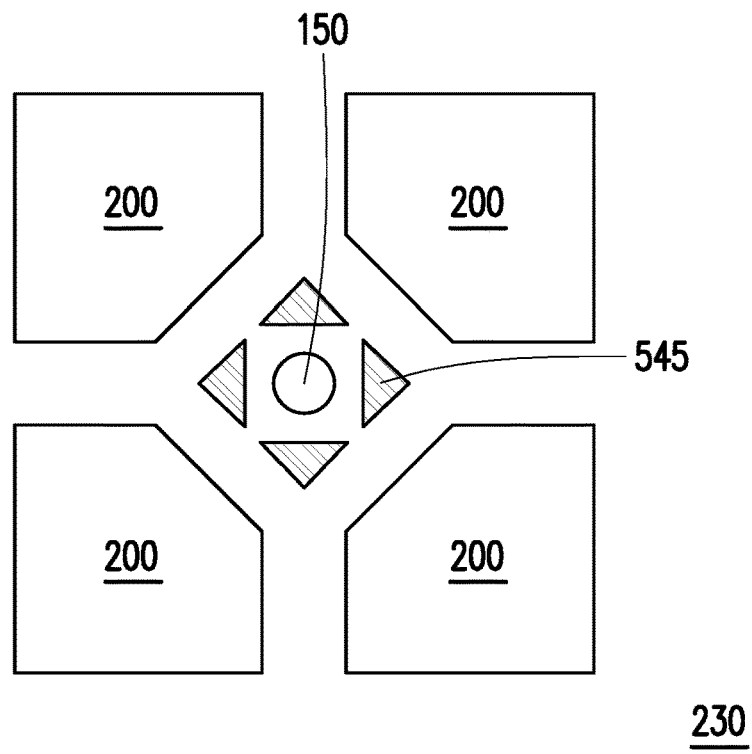
Figure 6D:
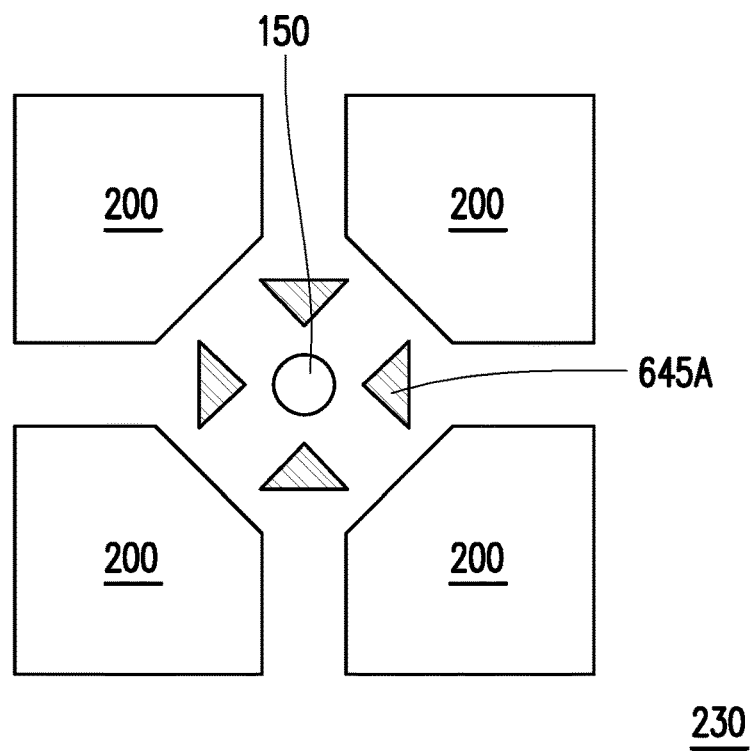
Figure 6E:
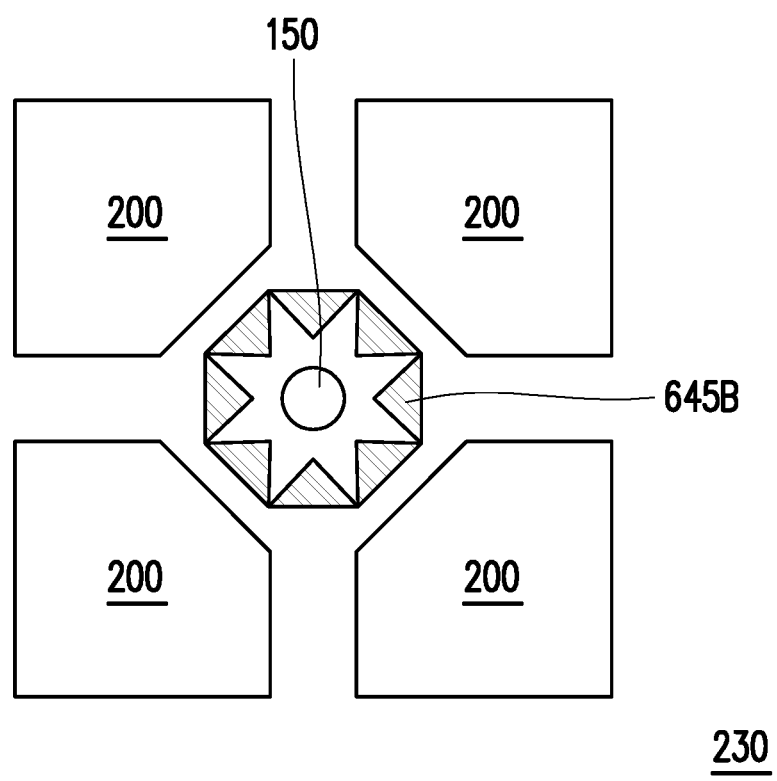

As shown in FIG. 6A, a dam structure 345 is a continuous ring structure that surrounds the through hole 150. As shown in FIG. 6B, a dam structure 445 may include a first ring structure 445a and a second ring structure 445b arranged in a concentric circle. The first ring structure 445a is located between the through hole 150 and the second ring structure 445b. The dual ring structure can provide a further blocking effect to avoid the underfill overflowing into the through hole 150. In addition, the dual ring structure can more accurately locate the position of the underfill material overflowing, thereby further controlling the dispensing process of the underfill material. Although only two ring structures are illustrated in FIG. 6B, the number of the dies is not limited by the disclosure. In other embodiments, the dam structure 445 may include a plurality of ring structures arranged in a concentric circle. As shown in FIG. 6C, a dam structure 545 may include four triangular structures. One edge of each triangular structure faces through hole 150, while one vertex of each triangular structure faces outward. As shown in FIG. 6D, a dam structure 645A may also include four triangular structures. One vertex of each triangular structure faces through hole 150, while one edge of each triangular structure faces outward. As shown in FIG. 6E, a dam structure 645B may include eight triangular structures. One vertex of each triangular structure faces through hole 150, while one edge of each triangular structure faces outward. The edges of all triangular structures are connected to each other and form an octagonal perimeter. In addition to the foregoing embodiments, various shapes of the dam structures are also within the scope of the embodiments of the present disclosure.

In addition to the said dam structure with different shapes in the top view, the said dam structure also has different profiles or configuration in the cross-sectional view. The detail is shown as below.

Figure 7A:
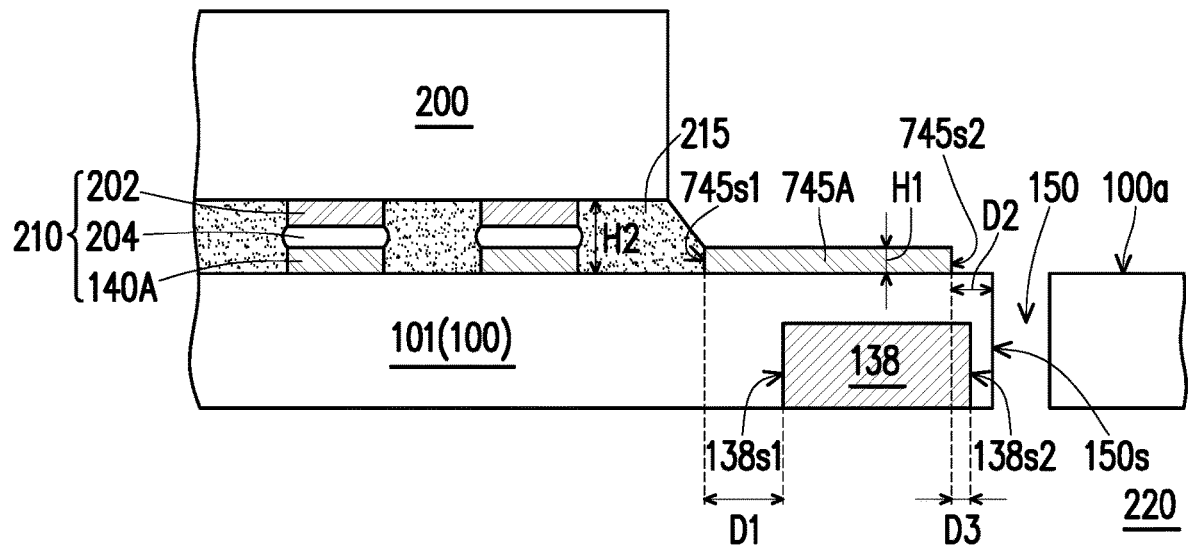
FIG. 7A and FIG. 7B are some embodiments of an enlarged cross-sectional view of a region illustrated in FIG. 1C.
Figure 7B:
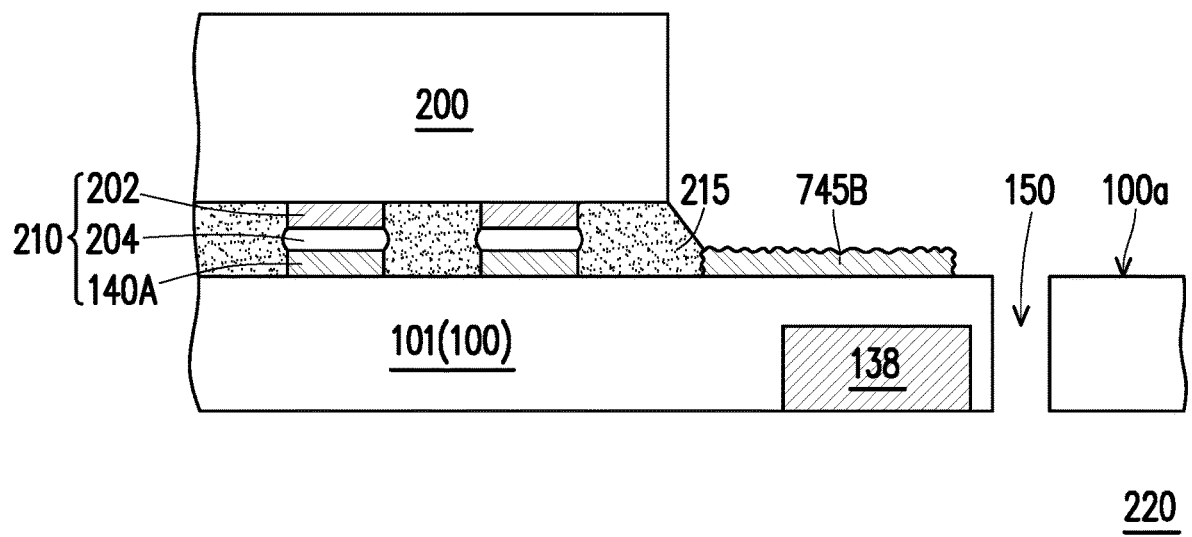

FIG. 7A and FIG. 7B respectively show an enlarged cross-sectional view of a region 220 of FIG. 1C.

Referring to FIG. 7A, a dam structure 745A is offset from the seal ring 138. In detail, a projection of the dam structure 745A projected on the first surface 100a of the composite wafer 100 is partially overlapped with a projection of the seal ring 138 projected on the first surface 100a of the composite wafer 100. The dam structure 745A has an inner sidewall 745s1 and an outer sidewall 745s2. The seal ring 138 has an inner sidewall 138s1 and an outer sidewall 138s2. As shown in FIG. 7A, the inner sidewall 745s1 of the dam structure 745A and the inner sidewall 138s1 of the seal ring 138 are spaced by a distance D1. In some embodiments, the distance D1 is less than or equal to 1 μm. The outer sidewall 745s2 of the dam structure 745A and the sidewall 150s of the through hole 150 are spaced by a distance D2. In some embodiments, the distance D2 is less than or equal to 1 μm. The outer sidewall 745s2 of the dam structure 745A and the outer sidewall 138s2 of the seal ring 138 are spaced by a distance D3. In some embodiments, the distance D3 is in a range of 0 to 1 μm. That is, the outer sidewall 138s2 of the seal ring 138 may be closer to the sidewall 150s of the through hole 150 than the outer sidewall 745s2 of the dam structure 745A. Alternatively, the outer sidewall 745s2 of the dam structure 745A may be aligned with the outer sidewall 138s2 of the seal ring 138. In addition, since the dam structure 745A and the first conductive feature 140A of the connector 210 are formed in the same step and has the same level, a height H1 of the dam structure 745A is less than a height H2 of the connector 210. In some embodiments, the height H1 is in a range of 7 μm to 30 μm, the height H2 is in a range of 30 μm to 500 μm, and a ratio of the height H2 to the height H1 (i.e., H2/H1) is in a range of 1 to 71.44.

Referring to FIG. 7B, unlike the dam structure 745A with a flat surface, a dam structure 745B has an uneven surface. In some embodiments, the uneven surface has a plurality of protrusions toward outward to increase the roughness. The uneven surface can further grab the underfill material from overflowing into the through hole 150. In some embodiments, the dam structure 745B with the uneven surface is formed by a surface treatment or additional forming steps illustrated in the subsequent FIG. 9D.

Figure 8A:
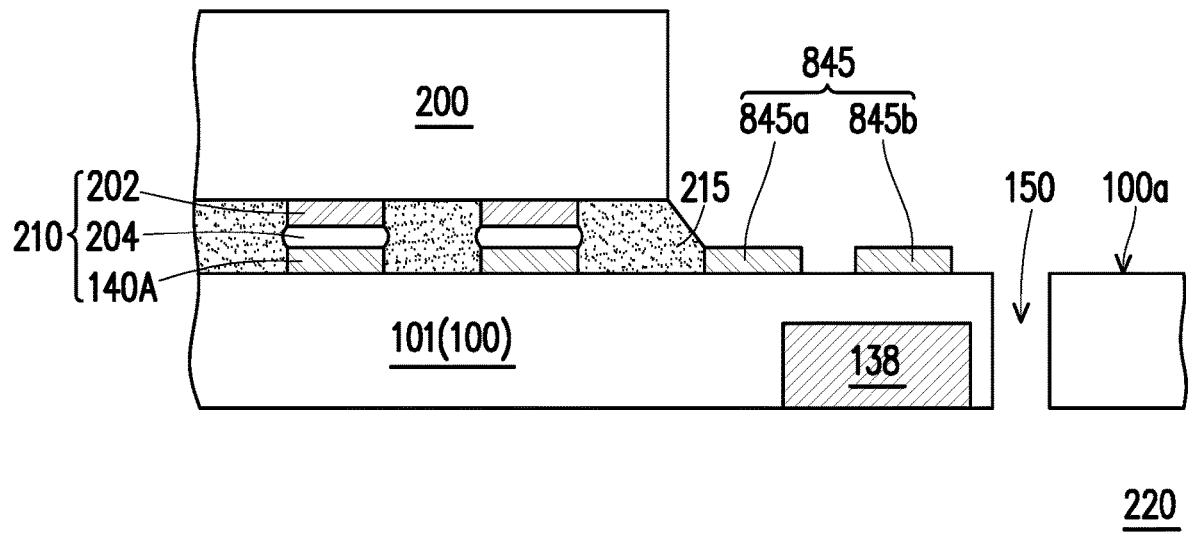
FIG. 8A and FIG. 8B are alternative embodiments of an enlarged cross-sectional view of a region illustrated in FIG. 1C.
Figure 8B:
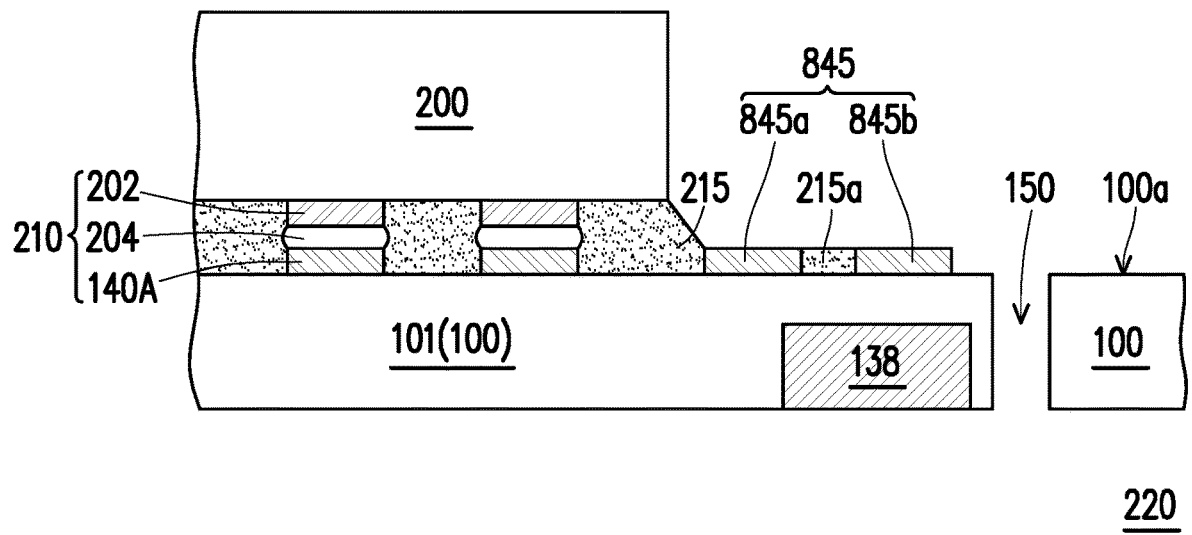

FIG. 8A and FIG. 8B respectively show an enlarged cross-sectional view of a region 220 of FIG. 1C.

Referring to FIG. 8A and FIG. 8B, a dam structure 845 may include a first ring structure 845a and a second ring structure 845b. When the underfill material overflows, a portion of the underfill material further fills in a space between the first ring structure 845a and the second ring structure 845b. After curing the underfill material, the underfill 215 may have an extending portion 215a further disposed between the first and second ring structures 845a and 845b, as shown in FIG. 8B. The dual ring structure can provide a further blocking effect to avoid the underfill overflowing into the through hole 150. In addition, the dual ring structure can more accurately locate the position of the underfill material overflowing, thereby further controlling the dispensing process of the underfill material.

Referring back to FIG. 1D, after the underfill 215 is formed, a clamp 300 is used to apply a clamping force between the die 200 and the composite wafer 100, thereby forming a package structure 10. The clamp 300 is able to reduce any warpage in package structure 10. Specifically, the clamp 300 may include a lower plate 302, an upper plate 304, and a plurality of fasteners 306. In some embodiments, the lower plate 302 and the upper plate 304 may be formed of a material, such as aluminum, stainless steel, copper, nickel-plated copper, copper tungsten, aluminum silicon carbide, or the like. The lower plate 302 and the upper plate 304 may include the same material or different materials. In the present embodiment, the lower plate 302 is a heat sink to provide the heat dissipation for the composite wafer 100, and the upper plate 304 is a cold plate to decrease the temperature generated from the die 200. The fasteners 306 may be screw-type fasteners, push-pin fasteners, magnetic fasteners, spring-lock fasteners, or any other type of fasteners. For example, the fasteners 306 may be bolts and nuts that thread to the bolts. During the clamping, the composite wafer 100 is mounted onto the lower plate 302; the upper plate 304 is mounted onto the die 200 by an adhesive 308; the bolts are passed and threaded through the through holes 150 of the composite wafer 100; and the nuts are threaded onto the bolts and tightened to clamp the composite wafer 100 and the overlying dies 200 between the upper plate 302 and the lower plate 304. The nuts may be tightened on the bolts to control the clamping force applied between the lower plate 302 and the upper plate 304.

In some alternative embodiments, distribution plates may be disposed between the lower plate 302 and the composite wafer 100 and/or between the upper plate 304 and the die 200. The distribution plates may be formed of an elastic material, a rubber material, or the like and may be used to evenly distribute the force applied by the clamp across the surfaces of the composite wafer 100 and/or the die 200.

FIG. 9A to FIG. 9E are schematic cross-sectional views illustrating a process flow for fabricating a package structure in accordance with a second embodiment of the present disclosure.

Figure 9A:
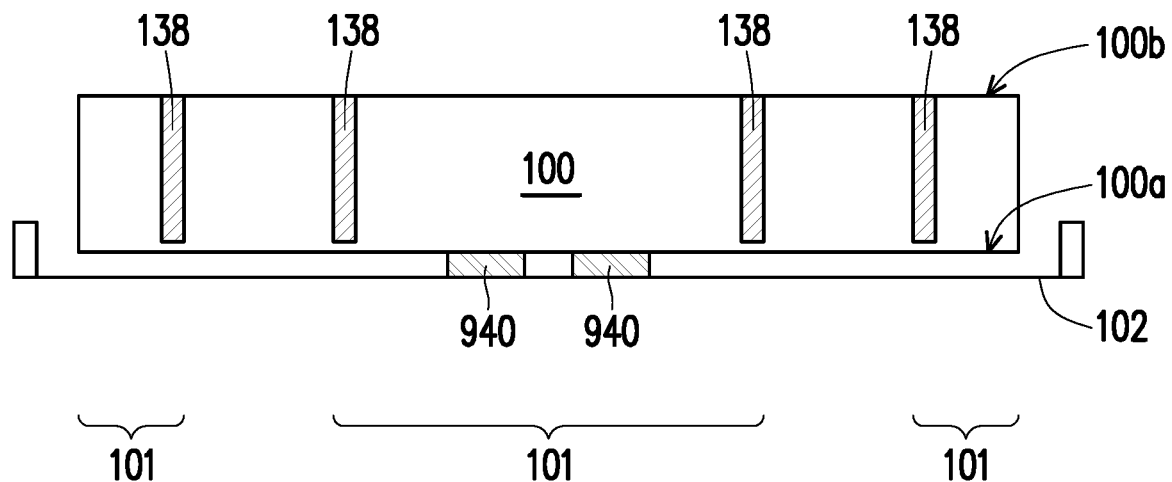
FIG. 9A to FIG. 9E are schematic cross-sectional views illustrating a process flow for fabricating a package structure in accordance with a second embodiment of the present disclosure.

Referring to FIG. 9A, the structure of the second embodiment is similar to the structure of the first embodiment, namely, the structures, materials, and functions of the composite wafer 100 of FIG. 9A are similar to those of the composite wafer 100 of FIG. 1A, and thus the details are omitted herein. The main difference there-between lies in that the structure of FIG. 9A has a conductive layer 940 including a plurality of conductive features formed on the first surface 100a of the composite wafer 100, while no dam structure is formed between the conductive features and the seal rings 138.

Figure 9B:
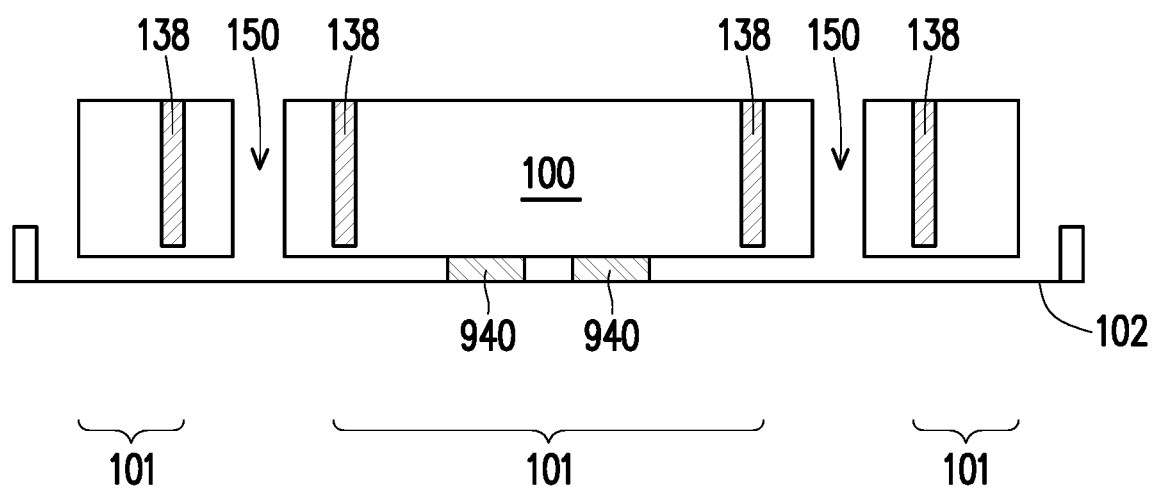

Referring to FIG. 9B, a plurality of through holes 150 are formed between the seal rings 138 by a drilling process, such as laser drilling, mechanical drilling, or the like. The through holes 150 penetrate through the first surface 100a and the second surface 100b of the composite wafer 100. In some embodiments, the through holes 150 is referred to as screw holes or bolt holes.

Figure 9C:
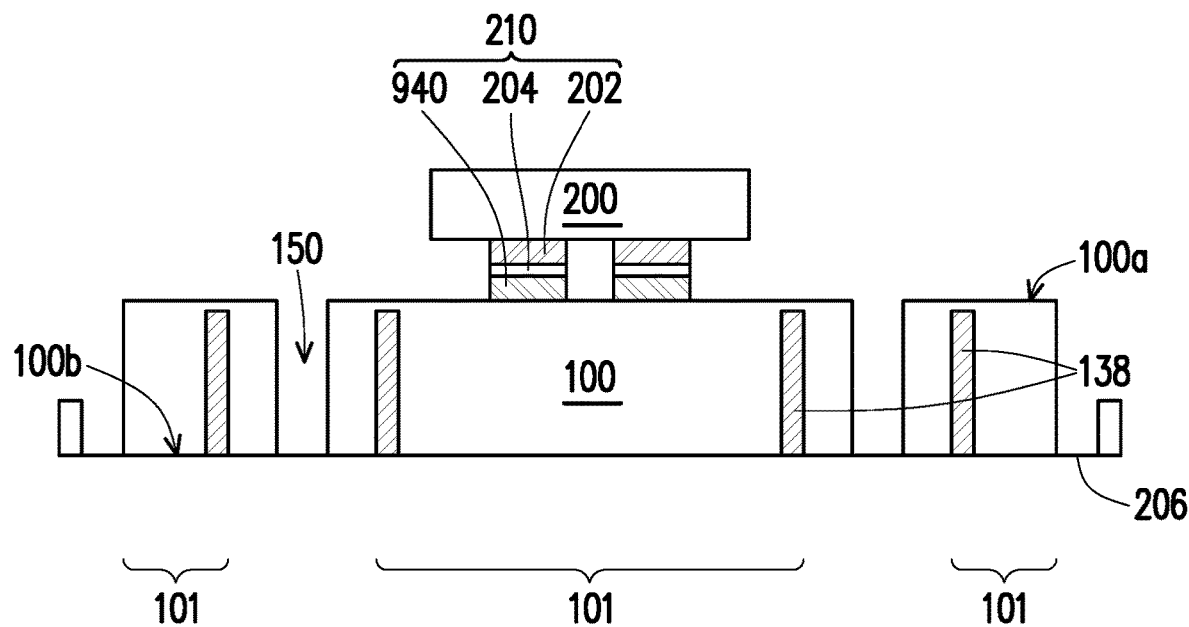

FIG. 9C illustrates a tape swap. During the tape swap, another tape 206 is attached onto the second surface 100b of the composite wafer 100, while the tape 102 is attached onto the first surface 100a of the composite wafer 100 (as shown in FIG. 9B). Next, the composite wafer 100 is demounted from the tape 102. In the case, the first surface 100a of the composite wafer 100 faces upward, as shown in FIG. 9C.

After the tape swap, a die 200 with a plurality of contacts 202 and a plurality of solder caps 204 is provided. Thereafter, the contacts 202 and the solder caps 204 of the die 200 are aligned with the conductive features 940 of the composite wafer 101. A joint process is then performed to joint the contacts 202 and the solder caps 204 onto the conductive features 940, so as to form a plurality of connectors 210. After the joint process, the die 200 is bonded onto the corresponding package 101.

Figure 9D:
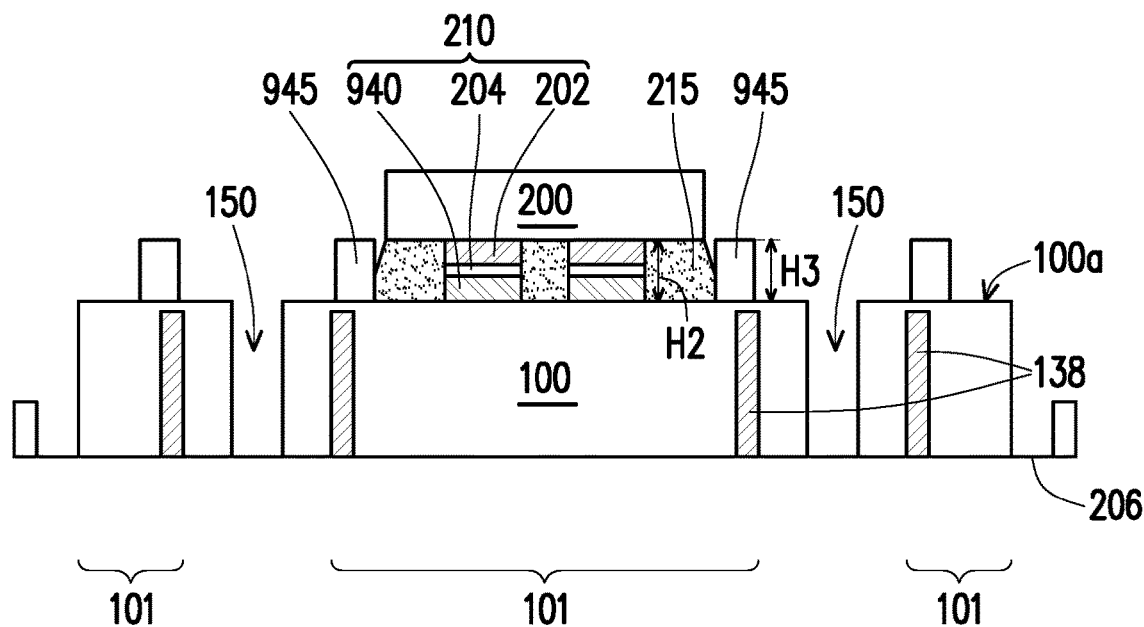

Referring to FIG. 9D, after bonding the die 200 onto the package 101, a plurality of dam structures 945 are formed between the connectors 210 and the seal rings 138. In some embodiments, the dam structures 945 are formed of a polymer material, such as acrylic, epoxy, PBO, polyimide, or the like. The dam structures 945 may also be formed of a metal material, such as a silver paste, an aluminum paste, a silver-aluminum paste, or the like. In some embodiments, the dam structures 945 are formed by dispensing, stencil print, or the like. When dispensed or printed, the dam structures 945 may be slightly flowable with high viscosity. Although the dam structures 945 of FIG. 9D in the cross-sectional views are rectangle, the top and sidewall shapes of the dam structures 945 become smoothened and curved after the dispensing or printing. In some alternative embodiments, the dam structures 945 may have uneven surfaces, as shown in FIG. 7B. In some embodiments, a height H3 of the dam structures 945 is less than or equal to a height H2 of the connector 210. In some alternative embodiments, the height H3 of the dam structures 945 is less than or equal to a sum of the height H2 of the connector 210 and a thickness of the die 200 (the thickness of the die 200 may be 1 cm). In the case, top surfaces of the dam structures 945 may be flush with or less than a top surface of the die 200. The height H3 may be in a range of 30 μm to 1500 μm (i.e., H2+1 cm), the height H2 is in a range of 30 μm to 500 μm, and a ratio of the height H3 to the height H2 (i.e., H3/H2) is in a range of 1 to 50.

After forming the dam structures 945, an underfill material is dispensed to fill in the gaps between the connectors 210. After curing the underfill material, an underfill 215 is formed to laterally encapsulate the connectors 210. It should be noted that dam structures 945 between the seal rings 138 and the conductive features 940 are able to prevent the underfill material from flowing or bleeding into the through holes 150, thereby separating the underfill 215 from the through holes 150. In addition, the dam structures 945 may be referred to as a monitor mark to control the dispensing process of the underfill material.

Figure 9E:
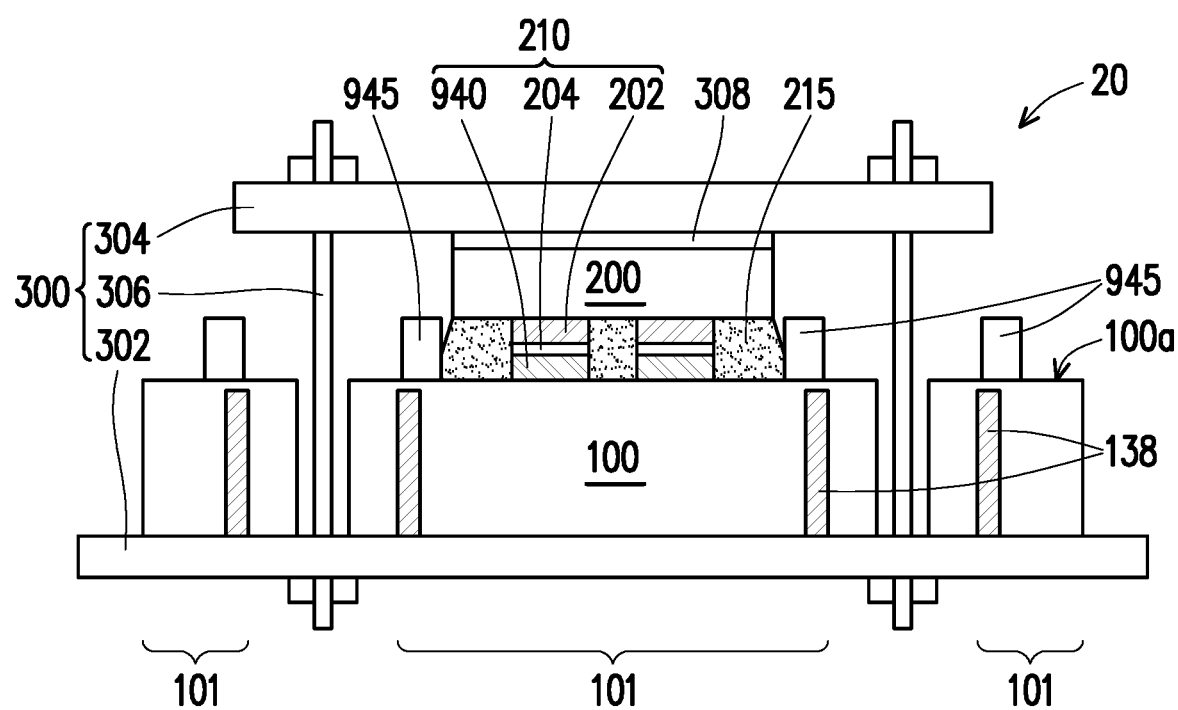

Referring to FIG. 9E, after the underfill 215 is formed, a clamp 300 is used to apply a clamping force between the die 200 and the composite wafer 100, thereby forming a package structure 20 and reducing the warpage in package structure 20. Specifically, the clamp 300 may include a lower plate 302, an upper plate 304, and a plurality of fasteners 306. In the present embodiment, the lower plate 302 is a heat sink to provide the heat dissipation for the composite wafer 100, and the upper plate 304 is a cold plate to decrease the temperature generated from the die 200. The fasteners 306 may be screw-type fasteners, push-pin fasteners, magnetic fasteners, spring-lock fasteners, or any other type of fasteners. For example, the fasteners 306 may be bolts and nuts that thread to the bolts. During the clamping, the composite wafer 100 is mounted onto the lower plate 302; the upper plate 304 is mounted onto the die 200 by an adhesive 308; the bolts are passed and threaded through the through holes 150 of the composite wafer 100; and the nuts are threaded onto the bolts and tightened to clamp the composite wafer 100 and the overlying dies 200 between the upper plate 302 and the lower plate 304. The nuts may be tightened on the bolts to control the clamping force applied between the lower plate 302 and the upper plate 304.

In some alternative embodiments, distribution plates may be disposed between the lower plate 302 and the composite wafer 100 and/or between the upper plate 304 and the die 200. The distribution plates may be formed of an elastic material, a rubber material, or the like and may be used to evenly distribute the force applied by the clamp across the surfaces of the composite wafer 100 and/or the die 200.

According to some embodiments, a package structure includes a composite wafer, a plurality of dies, an underfill, and a plurality of dam structures. The composite wafer has a first surface and a second surface opposite to each other.

The composite wafer includes a plurality of seal rings dividing the composite wafer into a plurality of packages; and a plurality of through holes respectively disposed between the seal rings and penetrating through the first and second surfaces. The dies are respectively bonded onto the packages at the first surface by a plurality of connectors. The underfill laterally encapsulates the connectors. The dam structures are disposed on the first surface of the composite wafer to separate the underfill from the through holes.

According to some embodiments, a method includes: providing a composite wafer with a first surface and a second surface opposite to each other, wherein the composite wafer comprises a plurality of seal rings dividing the composite wafer into a plurality of packages; forming a conductive layer on the first surface of the composite wafer, wherein the conductive layer comprises: a first conductive feature electrically connected to the composite wafer; and a second conductive feature formed between the first conductive feature and a corresponding seal ring; forming a plurality of through holes in the composite wafer to respectively penetrate through the first and second surfaces of the composite wafer; respectively bonding a plurality of dies onto the plurality of packages at the first surface by the first conductive feature; and forming an underfill to laterally encapsulate the first conductive feature, wherein the second conductive feature separates the underfill from the plurality of through hole.

According to some embodiments, a method includes: providing a composite wafer with a first surface and a second surface opposite to each other, wherein the composite wafer comprises a plurality of seal rings divided the composite wafer into a plurality of packages; forming a plurality of conductive features on the first surface of the composite wafer; forming a plurality of through holes in the composite wafer to respectively penetrate through the first and second surfaces of the composite wafer; performing a joint process to respectively joint a plurality of contacts of a plurality of dies onto the plurality of conductive features and form a plurality of connectors bonding the plurality of dies and the plurality of packages; after the joint process, forming a plurality of dam structures between the plurality of connectors and the plurality of seal rings; and forming an underfill to laterally encapsulate the plurality of connectors, wherein the plurality of dam structures separate the underfill from the plurality of through hole.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
    a composite wafer, having a first surface and a second surface opposite to each other, wherein the composite wafer comprises:
        a plurality of seal rings, dividing the composite wafer into a plurality of packages; and
        a plurality of through holes, respectively disposed between the plurality of seal rings and penetrating through the first and second surfaces;
    a plurality of dies, respectively bonded onto the plurality of packages at the first surface by a plurality of connectors;
    an underfill, laterally encapsulating the plurality of connectors; and
    a plurality of dam structures, disposed on the first surface of the composite wafer to separate the underfill from the plurality of through hole.

2. The package structure of claim 1, wherein a perimeter of one of the plurality of dies is located within a region enclosed by an inner sidewall of an underlying seal ring.

3. The package structure of claim 1, wherein one of the plurality of seal rings has an outer sidewall closer to an adjacent through hole than an outer sidewall of a corresponding dam structure.

4. The package structure of claim 1, wherein one of the plurality of dam structures surrounds a corresponding through hole.

5. The package structure of claim 1, wherein one of the plurality of dam structures comprises a first ring structure and a second ring structure arranged in a concentric circle.

6. The package structure of claim 5, wherein the underfill further extends to fill between the first and second ring structures.

7. The package structure of claim 1, wherein one of the plurality of dam structures has an uneven surface.

8. The package structure of claim 1, wherein a height of the plurality of dam structures is less than or equal to a height of the plurality of connectors.

9. The package structure of claim 1, further comprising:
    an upper plate, disposed on the plurality of dies;
    a lower plate, disposed on the second surface of the composite wafer; and
    a plurality of fasteners, respectively passing through the plurality of through holes to clamp the composite wafer and the overlying plurality of dies between the upper and lower plates.

10. A method, comprising:
    providing a composite wafer with a first surface and a second surface opposite to each other, wherein the composite wafer comprises a plurality of seal rings dividing the composite wafer into a plurality of packages;
    forming a conductive layer on the first surface of the composite wafer, wherein the conductive layer comprises:
        a first conductive feature electrically connected to the composite wafer; and
        a second conductive feature formed between the first conductive feature and a corresponding seal ring;
    forming a plurality of through holes in the composite wafer to respectively penetrate through the first and second surfaces of the composite wafer;
    respectively bonding a plurality of dies onto the plurality of packages at the first surface by the first conductive feature; and
    forming an underfill to laterally encapsulate the first conductive feature, wherein the second conductive feature separates the underfill from the plurality of through hole.

11. The method of claim 10, wherein the second conductive feature is a dam structure and electrically floated.

12. The method of claim 11, wherein a projection of the dam structure on the first surface is partially overlapped with a projection of a corresponding seal ring on the first surface.

13. The method of claim 10, wherein the second conductive feature surrounds a corresponding through hole.

14. The method of claim 10, further comprising:
mounting an upper plate on the plurality of dies;
mounting a lower plate on the second surface of the composite wafer; and
respectively passing a plurality of fasteners through the plurality of through holes to clamp the composite wafer and the overlying plurality of dies between the upper and lower plates.

15. The method of claim 14, wherein the upper plate is a cold plate, and the lower plate is a heat sink.

16. A method, comprising:
providing a composite wafer with a first surface and a second surface opposite to each other, wherein the composite wafer comprises a plurality of seal rings divided the composite wafer into a plurality of packages;
forming a plurality of conductive features on the first surface of the composite wafer;
forming a plurality of through holes in the composite wafer to respectively penetrate through the first and second surfaces of the composite wafer;
performing a joint process to respectively joint a plurality of contacts of a plurality of dies onto the plurality of conductive features and form a plurality of connectors bonding the plurality of dies and the plurality of packages;
after the joint process, forming a plurality of dam structures between the plurality of connectors and the plurality of seal rings; and
forming an underfill to laterally encapsulate the plurality of connectors, wherein the plurality of dam structures separate the underfill from the plurality of through hole.

17. The method of claim 16, wherein the plurality of dam structures comprise a polymer material, a metal material, or a combination thereof.

18. The method of claim 16, wherein a height of the plurality of dam structures is less than or equal to a height of the plurality of connectors.

19. The method of claim 16, further comprising:
mounting an upper plate on the plurality of dies;
mounting a lower plate on the second surface of the composite wafer; and
respectively passing a plurality of fasteners through the plurality of through holes to clamp the composite wafer and the overlying plurality of dies between the upper and lower plates.

20. The method of claim 19, wherein the upper plate is a cold plate, and the lower plate is a heat sink.

* * * * *